(12) United States Patent
Shen et al.

(10) Patent No.: US 9,172,032 B2
(45) Date of Patent: Oct. 27, 2015

(54) MAGNETIC TUNNEL JUNCTION DEVICE WITH PERPENDICULAR MAGNETIZATION AND METHOD OF FABRICATING THE SAME

(71) Applicant: Industrial Technology Research Institute, Hsinchu (TW)

(72) Inventors: Kuei-Hung Shen, Hsinchu (TW); Shan-Yi Yang, Hsinchu (TW); Yung-Hung Wang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/181,736

(22) Filed: Feb. 17, 2014

(65) Prior Publication Data

US 2014/0361391 A1 Dec. 11, 2014

(30) Foreign Application Priority Data

Jun. 5, 2013 (TW) .............................. 102119972 A
Oct. 21, 2013 (TW) .............................. 102137939 A

(51) Int. Cl.
*H01L 43/10* (2006.01)
*H01L 43/12* (2006.01)
(52) U.S. Cl.
CPC ................ *H01L 43/10* (2013.01); *H01L 43/12* (2013.01)
(58) Field of Classification Search
CPC ...... H01L 43/10; H01L 43/12; H01L 43/0802
See application file for complete search history.

(56) References Cited

U.S. PATENT DOCUMENTS

| 8,072,800 | B2 | 12/2011 | Chen et al. | |
| 2006/0256484 | A1* | 11/2006 | Sato et al. | 360/324.2 |
| 2011/0032644 | A1 | 2/2011 | Watts et al. | |
| 2012/0063218 | A1 | 3/2012 | Huai et al. | |
| 2012/0205758 | A1 | 8/2012 | Jan et al. | |
| 2012/0280336 | A1 | 11/2012 | Jan et al. | |
| 2014/0008742 | A1* | 1/2014 | Chen et al. | 257/421 |
| 2014/0048893 | A1* | 2/2014 | Wu et al. | 257/421 |

FOREIGN PATENT DOCUMENTS

TW 201246209 11/2012

OTHER PUBLICATIONS

Riki Shimabukuro, et al., "Electric field effects on magnetocrystalline anisotropy in ferromagnetic Fe monolayers," Physica E, Dec. 4, 2009, pp. 1014-1017.
Jeong-Heon Park, et al., "Enhancement of data retention and write current scaling for sub-20nm STT-MRAM by utilizing dual interfaces for perpendicular magnetic anisotropy," Symposium on VLSI Technology (VLSIT), Jun. 12-14, 2012, pp. 57-58.
(Continued)

*Primary Examiner* — Whitney T Moore
(74) *Attorney, Agent, or Firm* — Jianq Chyun IP Office

(57) ABSTRACT

A magnetic tunnel junction device with perpendicular magnetization including a reference layer, a tunneling dielectric layer, a free layer and a capping layer is provided. The tunneling dielectric layer covers on the reference layer. The free layer covers on the tunneling dielectric layer. The capping layer is consisted of magnesium, aluminum and oxygen, and disposed on the free layer.

11 Claims, 16 Drawing Sheets

(56) References Cited

OTHER PUBLICATIONS

H. X. Yang, et al, "First-principles investigation of the very large perpendicular magnetic anisotropy at Fe|MgO and Co|MgO interfaces," Physical Review B, Aug. 1, 2011, pp. 1-5.

Guenole Jan, et al., "High Spin Torque Efficiency of Magnetic Tunnel Junctions with MgO/CoFeB/MgO Free Layer," Applied Physics Express 5, Sep. 7, 2012, pp. 1-3.

Q. L. Ma, et al., "Effect of Mg interlayer on perpendicular magnetic anisotropy of CoFeB films in MgO/Mg/CoFeB/Ta structure," Applied Physics Letters, vol. 101, Issue 12, Sep. 2012, pp. 1-6.

Hiroyuki Yamamoto, et al., "Dependence of Magnetic Anisotropy in Co20Fe60B20 Free Layers on Capping Layers in MgO-Based Magnetic Tunnel Junctions with In-Plane Easy Axis," Applied Physics Express 5, Apr. 17, 2012, pp. 1-3.

\* cited by examiner

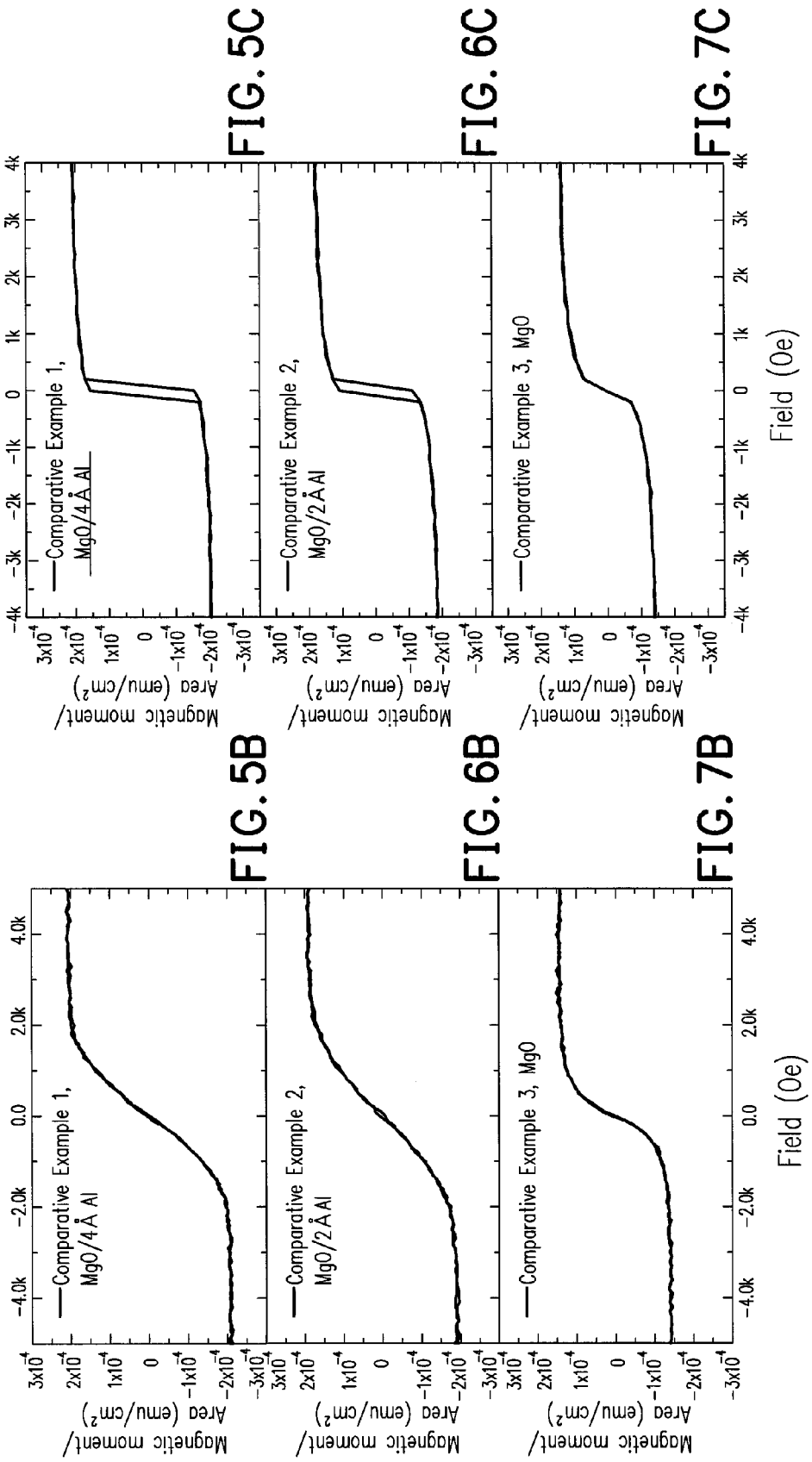

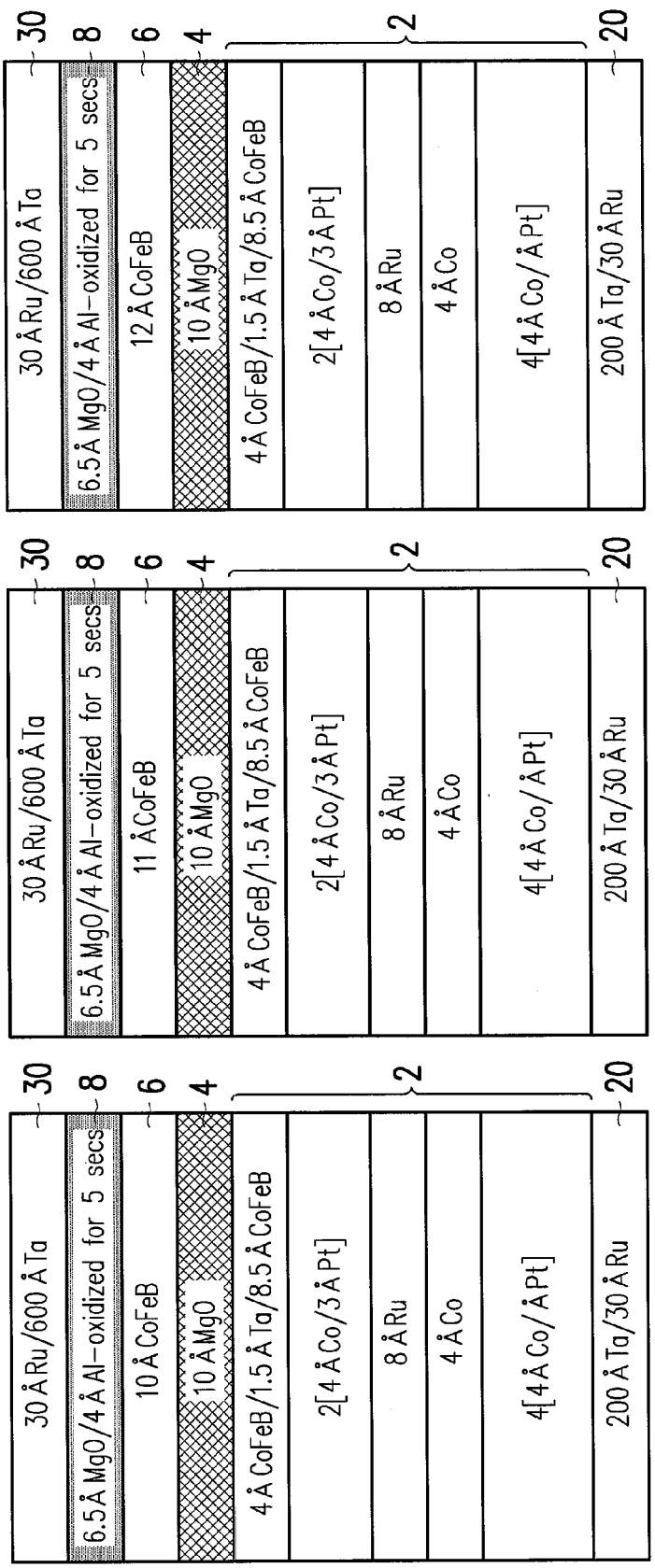

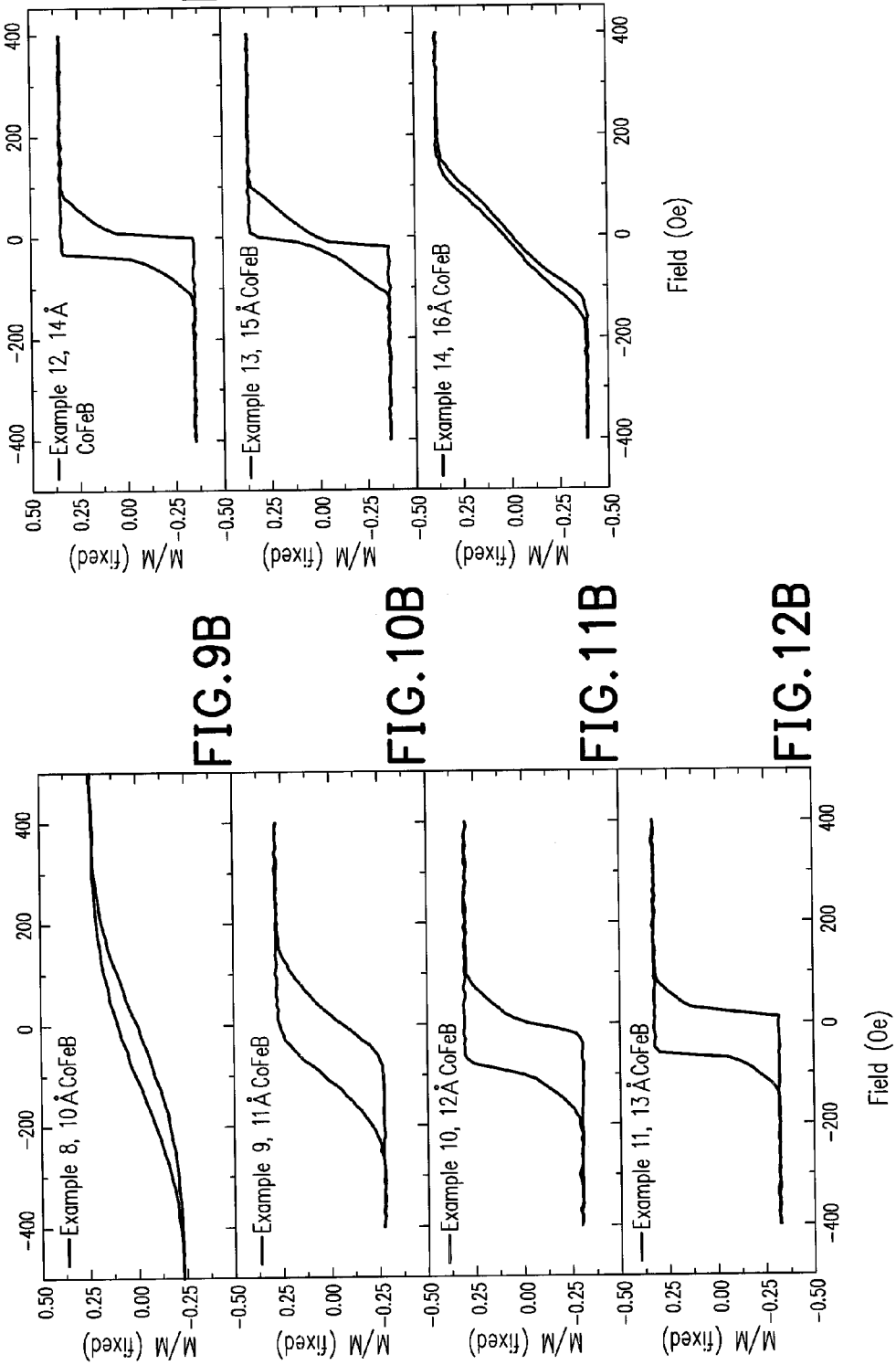

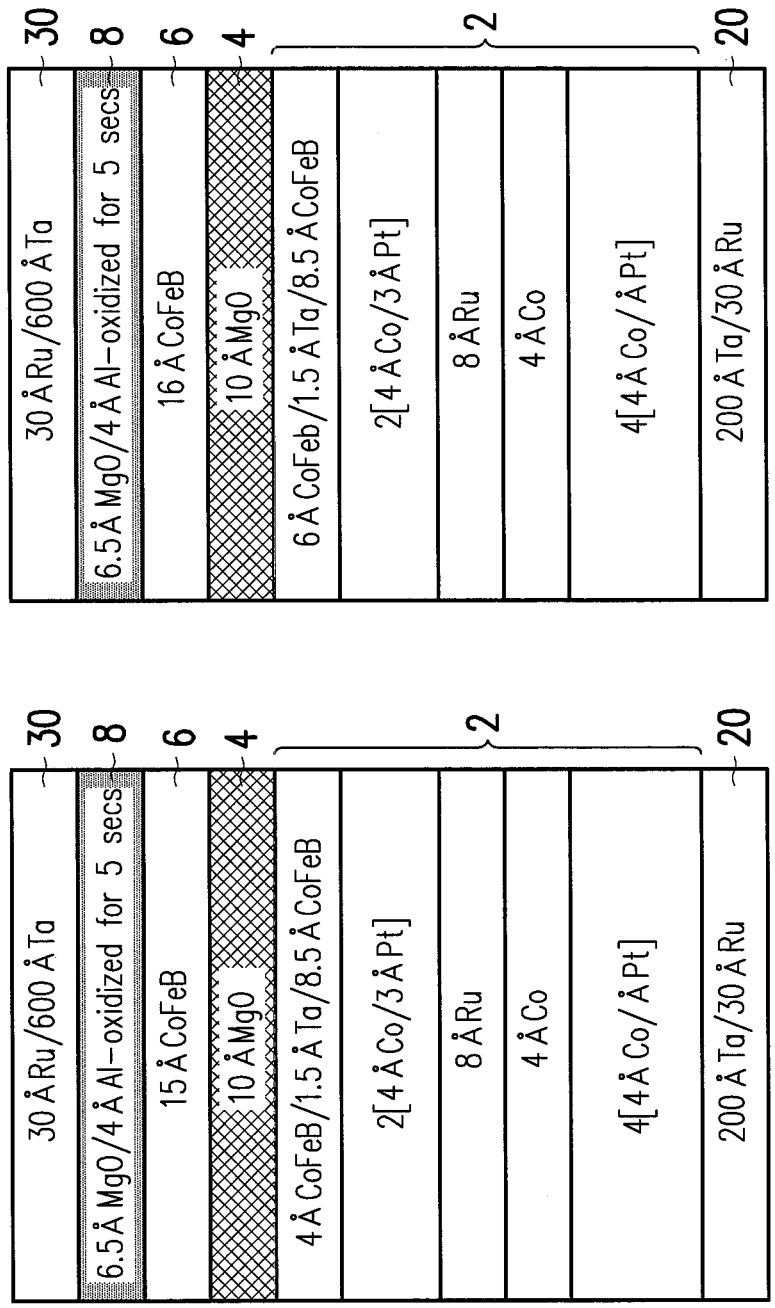

US 9,172,032 B2

MAGNETIC TUNNEL JUNCTION DEVICE WITH PERPENDICULAR MAGNETIZATION AND METHOD OF FABRICATING THE SAME

CROSS-REFERENCE TO RELATED APPLICATION

This application claims the priority benefits of Taiwan application serial no. 102119972, filed on Jun. 5, 2013, and Taiwan application serial no. 102137939, filed on Oct. 21, 2013. The entirety of each of the above-mentioned patent applications is hereby incorporated by reference herein and made a part of specification.

TECHNICAL FIELD

The disclosure relates to a magnetic tunnel junction device with perpendicular magnetization and a method of fabricating the same.

BACKGROUND

Perpendicular magnetic anisotropy (PMA) spin-RAM have advantages such as an ability of scalability, a low power consumption, a high performance and a high reliability, and thus is very likely to become a mainstream technique of the next-generation new non-volatile memory. However, to enhance a magnetoresistance ratio of devices and to reduce write currents, a free layer still has to be mainly composed of films of perpendicularly magnetized CoFeB or CoFe. Nonetheless, since such free layer has a low equivalent magnetic anisotropy coefficient ($K_{eff}$) and a small thickness, a thermal stability thereof is low; thus, the free layer fails to be a non-volatile memory. Therefore, it is proposed lately in literature that improvements to a thermal stability of the CoFeB or the CoFe free layer may be enhanced by using double layer of MgO. However, a process temperature thereof needs to be lower than a temperature for CMOS back-end-of-line (BEOL) process, otherwise a device characteristic may suffer a degradation. Accordingly, how to improve a heat resistance for the magnetic tunnel junction device with perpendicular magnetization is now an important issue to be solved in the field.

SUMMARY

The embodiments of the disclosure provide a magnetic tunnel junction device with perpendicular magnetization, including a reference layer, a tunneling dielectric layer, a free layer and a capping layer is provided. The tunneling dielectric layer has a first surface and a second surface. The reference layer is disposed on the first surface of the tunneling dielectric layer. The reference layer has a magnetization direction fixed on a direction perpendicular to a surface of the reference layer. The free layer has a magnetization direction parallel to or anti-parallel to the magnetization direction of the reference layer, and the free layer is disposed on the second surface of the tunneling dielectric layer. The capping layer is consisted of magnesium, aluminum and oxygen, and disposed on the free layer.

The embodiments of the disclosure provide a fabricating method of a magnetic tunnel junction device with perpendicular magnetization, including the following steps. A reference layer is formed. Then, a tunneling dielectric layer is formed to cover on the reference layer. Thereafter, a free layer is formed to cover on the tunneling dielectric layer. Afterwards, a capping layer consisted of magnesium, aluminum and oxygen is formed to cover the free layer.

To make the above features and advantages of the present disclosure more comprehensible, several embodiments accompanied with drawings are described in detail as follows.

BRIEF DESCRIPTION OF THE DRAWINGS

FIGS. 5A to 7A respectively illustrate hysteresis loops of the stack structures of Comparative Examples 1 to 3.

FIGS. 5B to 7B respectively illustrate out-of-plane hysteresis loops of the stack structures of Comparative Examples 1 to 3.

FIGS. 5C to 7C respectively illustrate in-plane hysteresis loops of the stack structures of Comparative Examples 1 to 3.

FIGS. 9A to 15A respectively illustrate the stack structures of Examples 8 to 14.

FIGS. 9B to 15B respectively illustrate out-of-plane hysteresis loops of the stack structures of Examples 8 to 14.

DETAILED DESCRIPTION

Figure 1A:
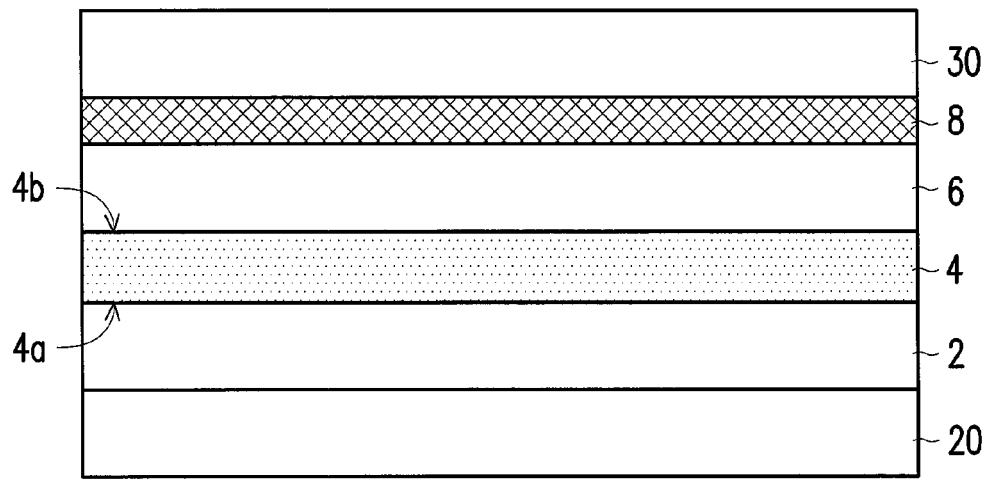
FIG. 1A is a schematic cross-sectional view illustrating a magnetic tunnel junction device with perpendicular magnetization according to an embodiment of the disclosure.
Figure 1B:
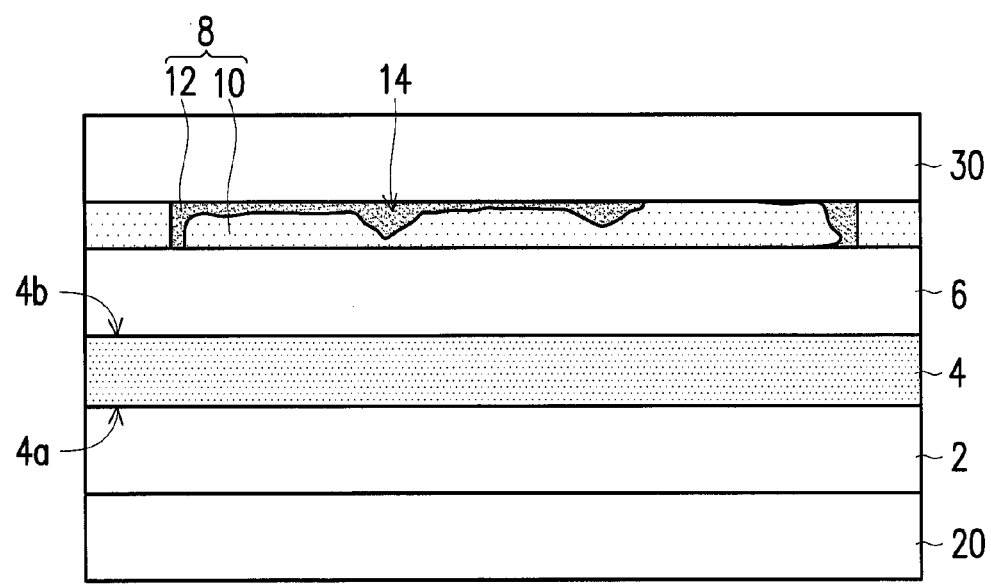
FIG. 1B is a schematic cross-sectional view illustrating a magnetic tunnel junction device with perpendicular magnetization according to another embodiment of the disclosure.

FIG. 1A is a schematic cross-sectional view illustrating a magnetic tunnel junction device with perpendicular magnetization according to first embodiment of the disclosure. FIG. 1B is a schematic cross-sectional view illustrating a magnetic tunnel junction device with perpendicular magnetization according to second embodiment of the disclosure.

Referring to FIG. 1A, the magnetic tunnel junction device with perpendicular magnetization according to present embodiment of the disclosure includes, from bottom up, a reference layer 2, a tunneling dielectric layer 4, a free layer 6 and a capping layer 8. In another embodiment, the magnetic tunnel junction device with perpendicular magnetization further includes a bottom layer 20 and a top layer 30.

The reference layer 2 (or a fixed layer) has a magnetization direction fixed on a direction perpendicular to a surface of the reference layer 2 (a film surface direction). The reference layer 2 may be any perpendicular magnetization material, such as a combination of stacked layers including a CoFeB single film and a Co/Pt multilayer film, a Co/Pd multilayer film, a Co/Ni multilayer film, a CoPd alloy film, a FePt alloy film, or a TbFeCo alloy film. In an embodiment, an 8 Å-thick Ru layer is provided between each of said films to compose an anti-parallel structure. According to an example, an interface where the reference layer 2 contacts the tunneling dielectric layer 4 is the CoFeB layer, a higher magnetoresistance ratio may be obtained by inserting a non-magnetic metal layer (e.g., a Ta layer of 1.5 Å to 3 Å) between each film layer among the Co/Pt multilayer film, Co/Pd multilayer film, Co/Ni multilayer film, CoPd alloy film, FePt alloy film, TbFeCo alloy film. A thickness of the reference layer 2 is, for example, 7 nm to 12 nm.

The tunneling dielectric layer 4 covers on the reference layer 2. In other words, the reference layer 2 is disposed on a first surface 4a of the tunneling dielectric layer 4. The tunneling dielectric layer 4 includes a metal oxide layer. The metal oxide layer is a magnesium oxide. A thickness of the tunneling dielectric layer 4 is, for example, 0.8 nm to 1 nm.

A magnetization direction of the free layer 6 may be altered by applying magnetic field thereto, and said magnetization direction is parallel to or anti-parallel to the magnetization direction of the reference layer 2. The free layer 6 covers on a second surface 4b of the tunneling dielectric layer 4. The free layer 6 is a ferromagnetic layer including a CoFeB single film, CoFe, Fe, CoFeBSi or a combination of above-said materials. In an example, a higher magnetoresistance ratio may be obtained by inserting a non-magnetic layer between each film layer among the layers in the free layer, and with an interface where the free layer 6 contacts the tunneling dielectric layer 4 is the CoFeB layer. A thickness of the free layer 6 is, for example, 1.1 nm to 1.6 nm.

The capping layer 8 is disposed on the free layer 6. The capping layer 8 is consisted of magnesium, aluminum and oxygen. In an embodiment, the capping layer 8 is a single magnesium oxide (MgAlxOy) layer, in which x is 0.2 to 1.2 and y is 1.5 to 4, as shown in FIG. 1A.

In another embodiment, referring to FIG. 1B, the capping layer 8 includes a magnesium oxide layer 10 and an aluminum oxide (AlOx) layer 12, in which x is 1.4 to 1.6. The aluminum oxide layer 12 covers the magnesium oxide layer 10 and fills in at least one gap 14 of the magnesium oxide layer 10. A thickness of the capping layer 8 is, for example, 0.6 nm to 1.1 nm.

The bottom layer 20 is disposed below the reference layer 2. The top layer 30 is disposed above the capping layer 8. A material of the bottom layer 20 and the top layer 30 includes a metal, an alloy or a combination thereof. The metal is, for example, tantalum, rhodium or tantalum nitride.

Figure 1C:
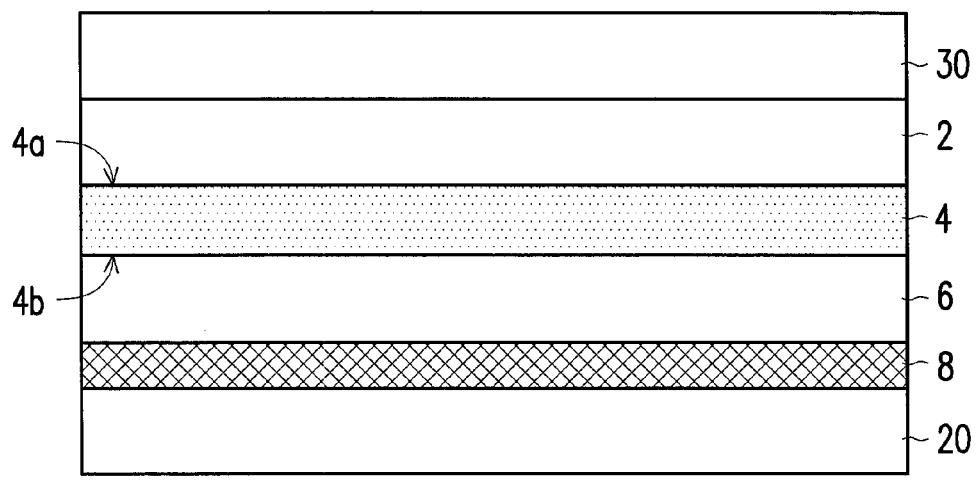
FIG. 1C is a schematic cross-sectional view illustrating a magnetic tunnel junction device with perpendicular magnetization according to yet another embodiment of the disclosure.
Figure 1D:
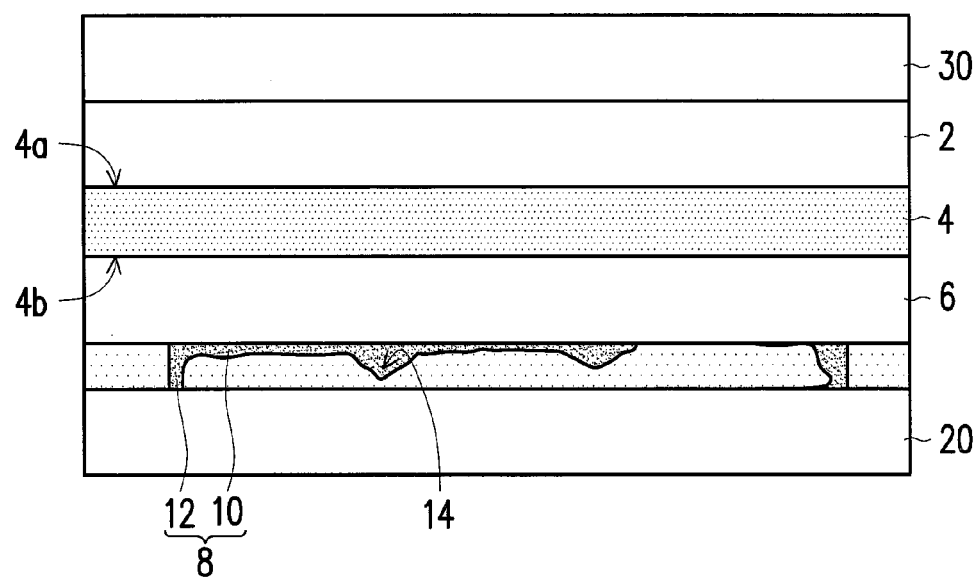
FIG. 1D is a schematic cross-sectional view illustrating a magnetic tunnel junction device with perpendicular magnetization according to still another embodiment of the disclosure.

FIG. 1C is a schematic cross-sectional view illustrating a magnetic tunnel junction device with perpendicular magnetization according to third embodiment of the disclosure. FIG. 1D is a schematic cross-sectional view illustrating a magnetic tunnel junction device with perpendicular magnetization according to fourth embodiment of the disclosure.

Referring to FIG. 1C, a structure of the present embodiment is similar to a structure of first embodiment, except positions of the capping layer 8, the free layer 6 and the reference layer 2 are slightly different. In the embodiment, the free layer 6 is disposed on a second surface 4b of the tunneling dielectric layer 4. The coating layer 8 is disposed below the free layer 6 and the above the bottom layer 20. The reference layer 2 is disposed above the first surface 4a of the tunneling dielectric layer 4 and below the top layer 30.

Referring to FIG. 1D, similarly, a structure of the embodiment is similar to the structure of second embodiment, except positions of the capping layer 8, the free layer 6 and the reference layer 2 are slightly different. In the embodiment, the free layer 6 is disposed below the tunneling dielectric layer 4 and in contact with the second surface 4b of the tunneling dielectric layer 4. The coating layer 8 is disposed below the free layer 6 and the above the bottom layer 20. The reference layer 2 is disposed above the first surface 4a of the tunneling dielectric layer 4 and below the top layer 30.

The method of forming the capping layer 8 is described in detail below.

Figure 2A:
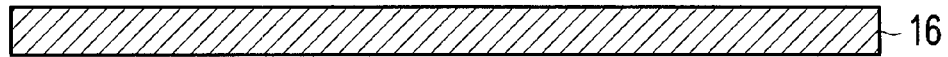
FIGS. 2A to 2B are schematic cross-sectional views illustrating a fabricating process of a capping layer of a magnetic tunnel junction device with perpendicular magnetization according to another embodiment of the disclosure.
Figure 2B:

FIGS. 2A to 2B are schematic cross-sectional views illustrating a fabricating process of a capping layer 8 of a magnetic tunnel junction device with perpendicular magnetization according to first and third embodiments of the disclosure.

Referring to FIGS. 2A and 2B, first, a magnesium aluminum alloy layer 16 is formed. Then, an oxidation process is performed to oxidize the magnesium aluminum alloy layer 16 to form the magnesium aluminum oxide layer as the capping layer 8. A method of forming the magnesium aluminum alloy layer 16 is a sputtering process, for example. A thickness of the magnesium aluminum alloy layer 16 is, for example, 6 Å to 10 Å. The oxidation process is, for example, a plasma oxidation process or a natural oxidation. Gas being introduced in the plasma oxidation process includes, for example, a gas mixture of oxygen and argon or oxygen, with a process time of 5 to 20 seconds. In addition, the capping layer 8 may also be directly formed by directly depositing the magnesium aluminum oxide layer. A method of depositing the magnesium aluminum oxide layer is, for example, a sputtering process or an atomic layer deposition. A thickness of the magnesium aluminum oxide layer is, for example, 0.6 nm to 1.1 nm.

Figure 3A:
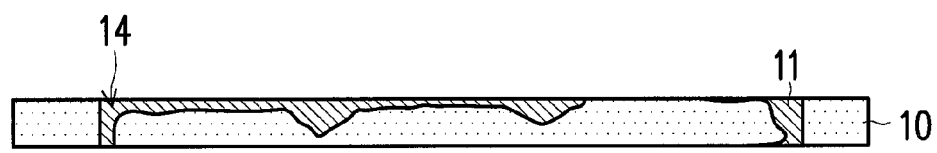
FIGS. 3A to 3B are schematic cross-sectional views illustrating a fabricating process of a capping layer of a magnetic tunnel junction device with perpendicular magnetization according to yet another embodiment of the disclosure.
Figure 3B:
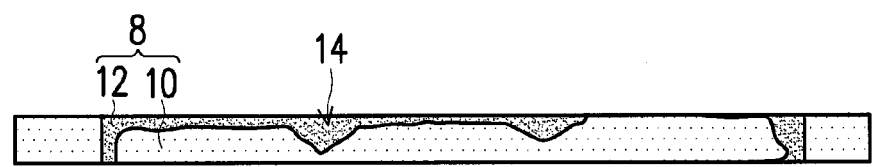

FIGS. 3A to 3B are schematic cross-sectional views illustrating a fabricating process of a capping layer of a magnetic tunnel junction device with perpendicular magnetization according to second and fourth embodiments of the disclosure.

Referring to FIG. 3A, the method of forming the capping layer 8 includes, first, forming the magnesium oxide layer 10. A method of forming the magnesium oxide layer 10 is, for example, a sputtering process or an atomic layer deposition. A thickness of the magnesium oxide layer 10 is, for example, 3.5 Å to 10 Å. An aluminum layer 11 is formed to cover the magnesium oxide layer 10. Due to an excellent atom mobility property, aluminum is suitable for being filled in the gap 14 of the magnesium oxide layer 10. A method of forming the aluminum layer 11 is, for example, a sputtering process or an atomic layer deposition. A thickness of the aluminum layer 11 is, for example, 3 Å to 4 Å, in order to at least fill in the gap 14 of the magnesium oxide layer 10.

Afterwards, referring to FIG. 3B, an oxidation process is performed to oxidize the aluminum layer 11 to form the aluminum oxide layer 12. The oxidation process is, for example, a plasma oxidation process or a natural oxidation. Gas being introduced in the plasma oxidation process is, for example, a gas mixture of oxygen with argon (Ar) and a process time of 5 to 50 seconds.

The reference layer 2, the tunneling dielectric layer 4, the free layer 6, the bottom layer 20 and the top layer 30 in the magnetic tunnel junction device with perpendicular magnetization depicted in FIG. 1A to FIG. 1D may be formed by any known methods, thus related description is omitted hereinafter. The annealing process in 300° C. to 400° C. for 20 minutes to 2 hours may be performed on the magnetic tunnel junction device with perpendicular magnetization being completed.

Example 1

Figure 4A:
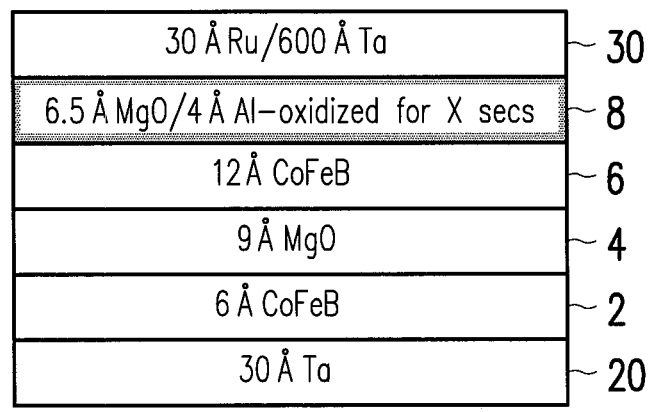
FIG. 4A illustrates the stack structures of Examples 1 to 6.
Figure 4B:
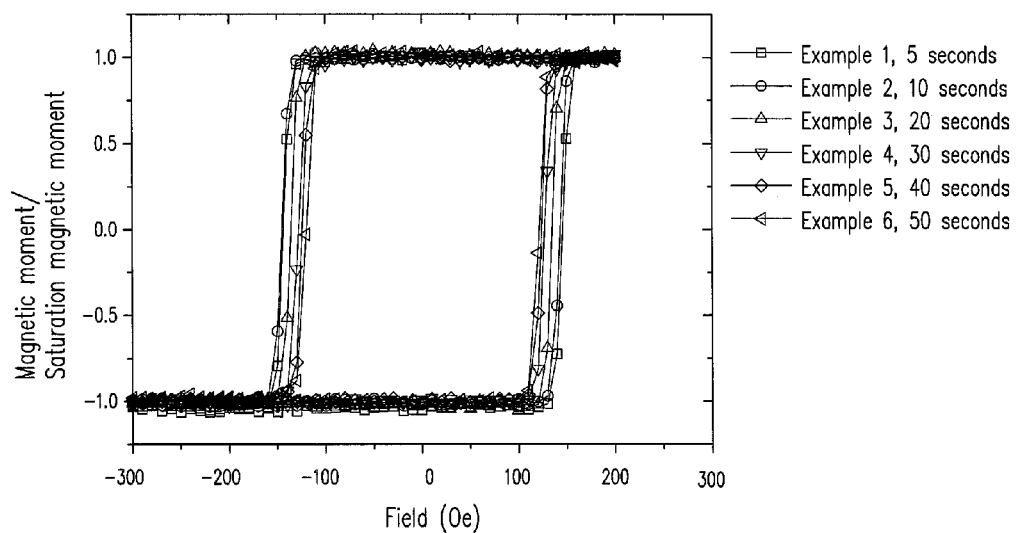
FIG. 4B illustrates out-of-plane hysteresis loops of the stack structures of Examples 1 to 6.
Figure 4C:
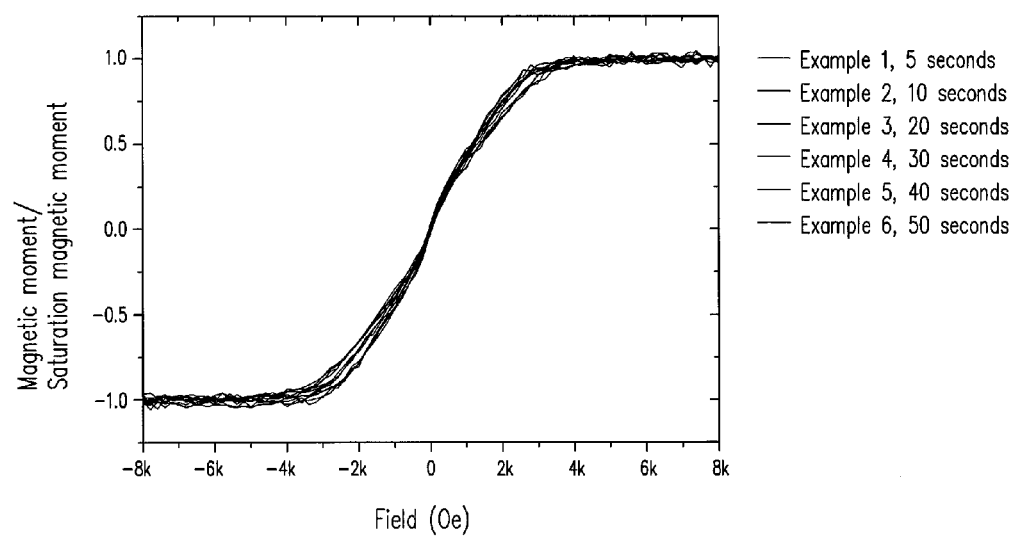
FIG. 4C illustrates in-plane hysteresis loops of the stack structures of Examples 1 to 6.

As shown in FIG. 4A, the bottom layer 20 is formed of 30 Å-thick Ta layer, the reference layer 2 is formed of a 6 Å-thick CoFeB layer, the tunneling dielectric layer 4 is formed of a 9 Å-thick MgO layer, the free layer 6 is formed of a 12 Å-thick CoFeB layer, the capping layer 8 is formed of a 6.5 Å-thick MgO/a 4 Å-thick Al layer—oxidized for X secs, and the top layer 30 is formed of a 30 Å-thick Ru layer and a 600 Å-thick Ta layer. After coating of this stacking film layer is completed, an annealing process is applied with 360° C. for 20 minutes. Therein, "4 Å-thick Al layer—oxidized for X secs" indicates that an oxidation with an oxygen plasma is performed for X seconds. In Example 1, X is 5 seconds. In Example 1, an out-of-plane hysteresis loop of the stack structure is as shown in FIG. 4B, and an in-plane hysteresis loop of the stack structure is as shown in FIG. 4C, which are configured to verify a characteristic of the CoFeB free layer in the stack structure of Example 1.

Examples 2 to 6

Examples 2 to 6 fabricate stack structures similar to the sequence of Example 1 (as shown in FIG. 4A), but an oxidation time (X) of the 4 Å-thick Al layer is changed to a 10 seconds, 20 seconds, 30 seconds, 40 seconds and 50 seconds, respectively. Therein, the out-of-plane hysteresis loop of each of the stack structures is as shown in FIG. 4B, and the in-plane hysteresis loop of each of the stack structures is as shown in FIG. 4C.

Comparative Example 1

Figure 5A:
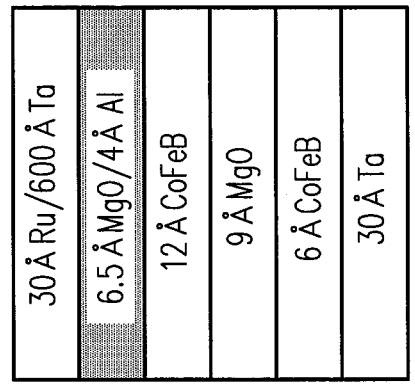

Comparative Example 1 fabricates a stack structure similar to the sequence of Example 1, but the 4 Å-thick Al layer is not oxidized. Therein, an out-of-plane hysteresis loop of the stack structure (as shown in FIG. 5A) is as shown in FIG. 5B, and an in-plane hysteresis loop of the stack structure is as shown in FIG. 5C.

Comparative Example 2

Figure 6A:
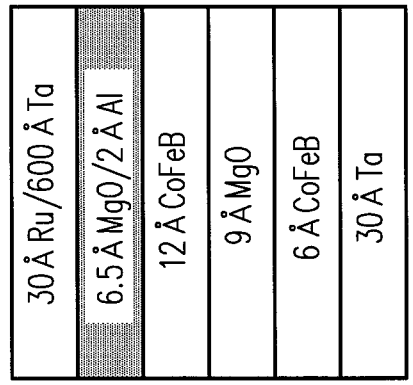

Comparative Example 2 fabricates a stack structure similar to the sequence of Example 1, but the 4 Å-thick Al layer is replace by a 2 Å-thick Al layer and no oxidation is performed. Therein, an out-of-plane hysteresis loop of the stack structure (as shown in FIG. 6A) is as shown in FIG. 6B, and an in-plane hysteresis loop of the stack structure is as shown in FIG. 6C.

Comparative Example 3

Figure 7A:
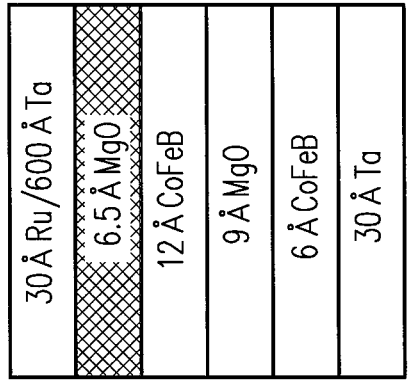

Comparative Example 3 fabricates a stack structure similar to the sequence of Example 1, but the 4 Å-thick Al layer is not formed and no oxidation is performed. Therein, an out-of-plane hysteresis loop of the stack structure (as shown in FIG. 7A) is as shown in FIG. 7B, and an in-plane hysteresis loop of the stack structure is as shown in FIG. 7C.

Results of Examples 1 to 6 show that the capping layer 8 (collectively called MgAlxOy) formed by covering the CoFeB layer with the MgO layer and the 4 Å-thick Al layer before performing an oxidation thereto, with a condition that the oxidation time is within a range of 5 to 50 seconds, a resulting device thereof may exhibit a PMA property. Results of Comparative Examples 1 to 3 show that in case no Al is covered on the MgO, a horizontal magnetization is exhibited and a magnetic moment thereof is relatively less than a magnetic moment of the capping layer 8 being MgAlxOy. This phenomenon shows that a thin MgO layer may include many defects, such that a magnetic moment of the free layer is dropped due to interdiffusion generated after an annealing process. However, if the aluminum layer is coated on the MgO but no oxidation is performed, as the thickness of the aluminum layer increasing with increase of the magnetic moment, despite it shows that the defects may be blocked to prevent occurrence of interdiffusion, a resulting device thereof cannot exhibit the PMA property because Fe—O orbit hybridization is a major origin of PMA of CoFeB.

Example 7

Figure 8A:
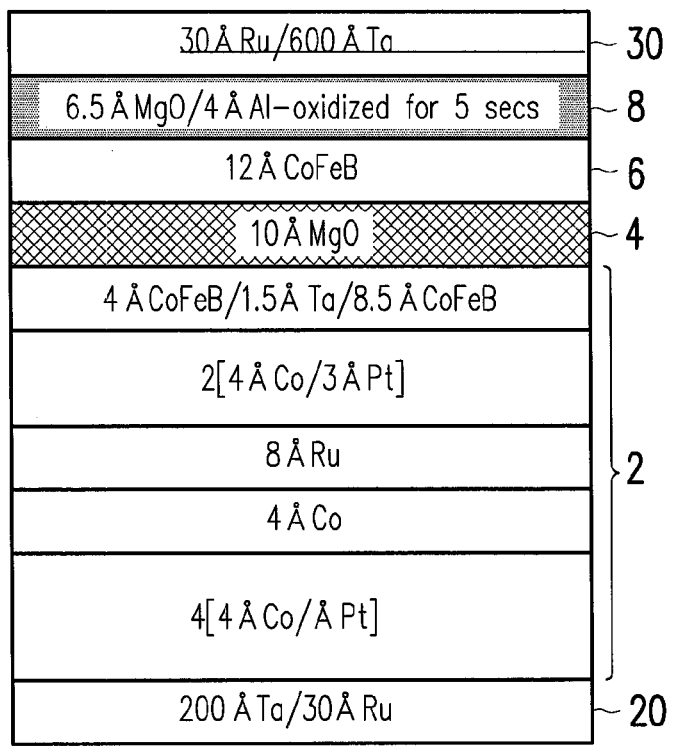
FIG. 8A illustrates the stack structure of Examples 7.
Figure 8B:
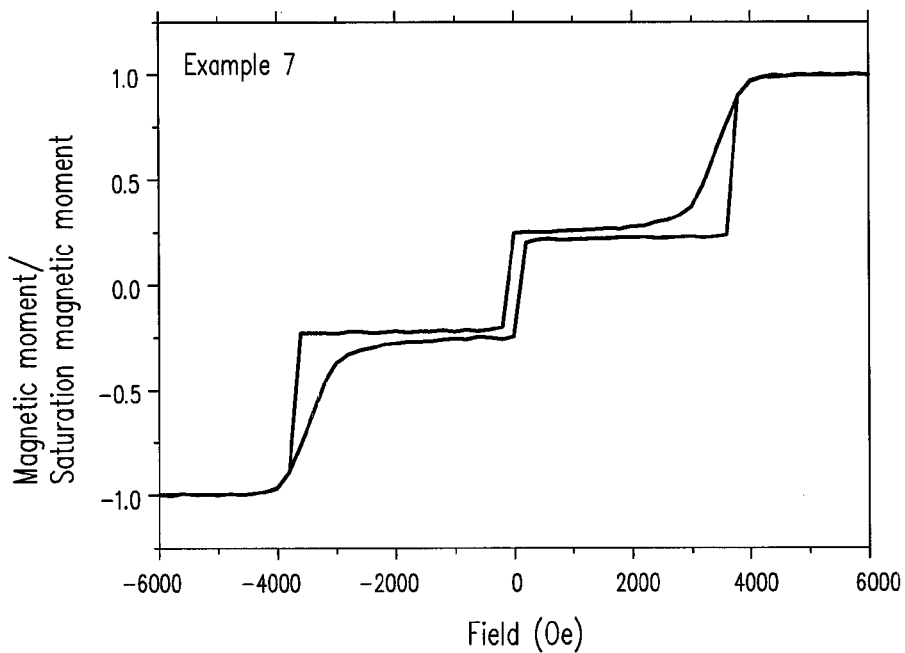
FIG. 8B illustrates an out-of-plane hysteresis loop of the stack structure of Example 7.
Figure 13A:
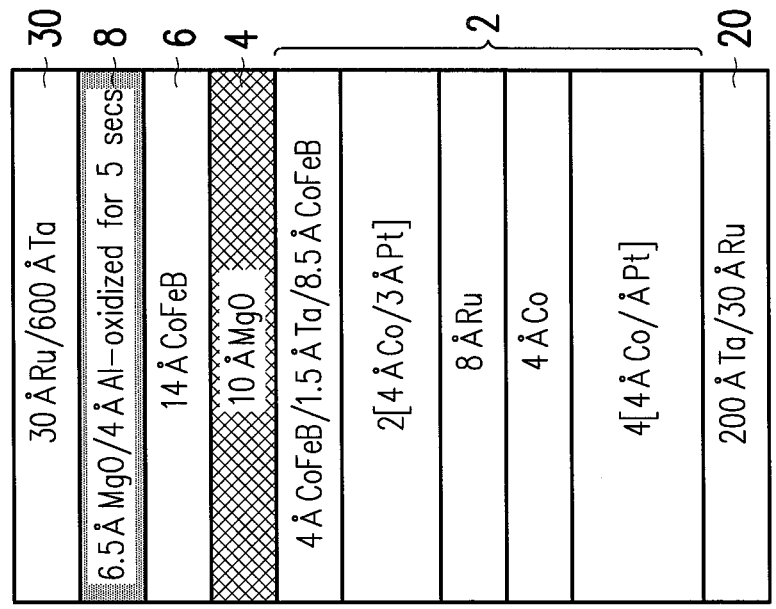
Figure 12A:
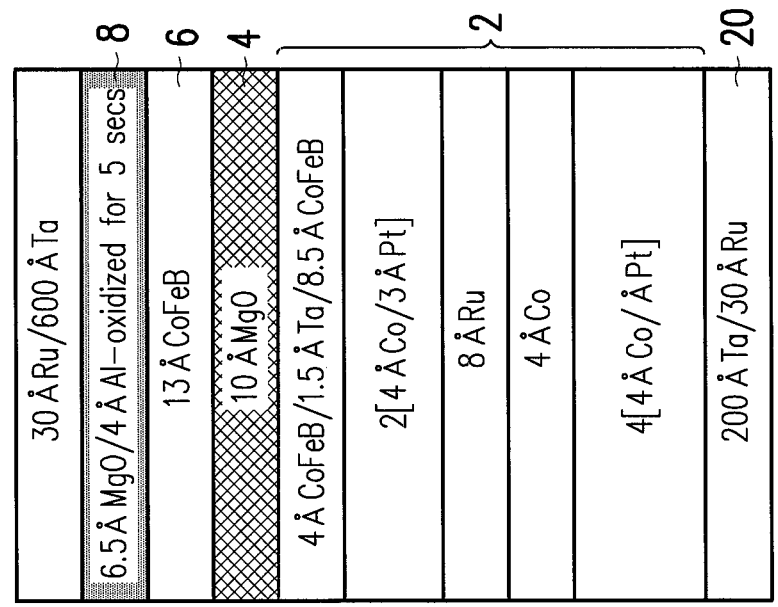

A stack structure (as shown in FIG. 8A) of Example 7 is fabricated by forming a 200 Å-thick Ta layer/a 30 Å-thick Ru layer/a 4-layers of [4 Å-thick Co/3 Å-thick Pt]/a 4 Å-thick Co layer/an 8 Å-thick Ru layer/a 2-layers of [4 Å-thick Co/3 Å-thick Pt]/a 4 Å-thick Co layer/a 1.5 Å-thick Ta layer/an 8.5 Å-thick CoFeB layer/a 10 Å-thick MgO layer/a 12 Å-thick CoFeB layer/a 6.5 Å-thick MgO layer/a 4 Å-thick Al layer—oxidized for 5 secs/a 30 Å-thick Ru layer/a 600 Å-thick Ta layer. Therein, (the 200 Å-thick Ta layer/the 30 Å-thick Ru layer) is the bottom layer 20, (the 4-layers of [4 Å-thick Co/3 Å-thick Pt]/the 4 Å-thick Co layer/the 8 Å-thick Ru layer/the 2-layers of [4 Å-thick Co/3 Å-thick Pt]/the 4 Å-thick Co layer/the 1.5 Å-thick Ta layer/the 8.5 Å-thick CoFeB layer) is the reference layer 2, the 10 Å-thick MgO layer is the tunneling dielectric layer 4, the 12 Å-thick CoFeB layer is the free layer 6, (the 6.5 Å-thick MgO layer/the 4 Å-thick Al layer—oxidized for 5 secs) is the capping layer 8, and (the 30 Å-thick Ru layer/the 600 Å-thick Ta layer) is the top layer 30. After coating of this stacking film layer is completed, an annealing process is applied with 360° C. for 20 minutes, so that the capping layer 8 is formed to have a structure of MgAlxOy. An out-of-plane hysteresis loop of the stack structure of Example 7 is as shown in FIG. 8B.

Result of FIG. 7 shows that the device formed by the MgAlxOy capping layer may include good PMA property.

Examples 8 to 14

Examples 8 to 14 fabricate stack structures (as shown in FIGS. 9A to 14A) similar to Example 7, but a thickness of the CoFeB layer served as the free layer 6 is replaced by 10 Å, 11 Å, 12 Å, 13 Å, 14 Å, 15 Å and 16 Å, respectively, with the condition of the annealing process being 360° C. for 20 minutes, out-of-plane hysteresis loops of the free layers 6 are as shown in FIGS. 9B to 14B, respectively.

Result of FIG. 8 shows that the device having the capping layer 8 of MgAlxOy may include good PMA property. According to VSM hysteresis loop, the energy barrier is up to 90 KbT, which is more than two times the device of conventional art in which a conventional free layer (CoFeB) with the metal layer (Ta) is served as the capping layer. Moreover, results of Examples 8 to 14 shows that the devices with the CoFeB layer having a thickness of 11 Å to 15 Å and served as the free layer 6 may all exhibit the PMA property. Whereas in the conventional art where the devices using Ta as the capping layer, the thickness of the CoFeB layer needs be narrow enough (only 11 Å to 13 Å) to exhibit the PMA property. Therefore, results of Examples 8 to 14 shows that, the capping layer 8 consisted of magnesium, aluminum and oxygen (MgAlxOy) may extend a thickness range required for the CoFeB free layer 6 to exhibit the PMA property.

Example 15

The Free Layer is CoFeB

Figure 16A:
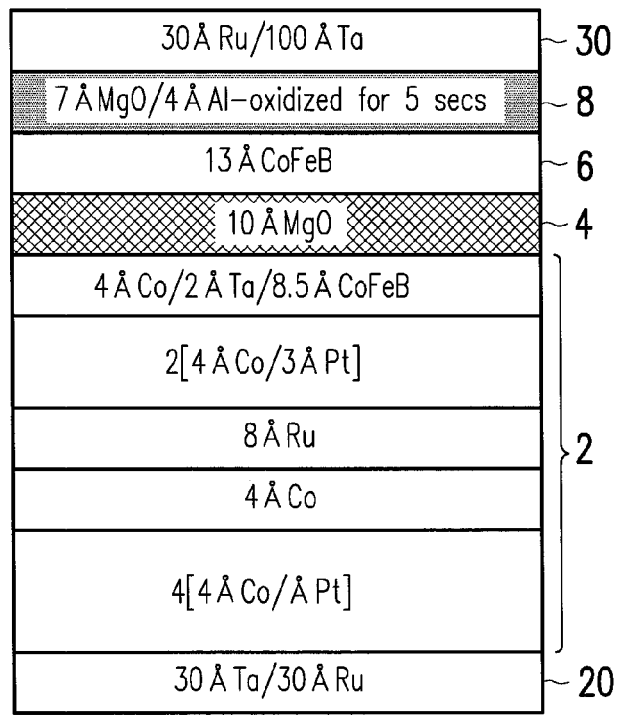
FIG. 16A illustrates the stack structure of Examples 15.
Figure 16B:
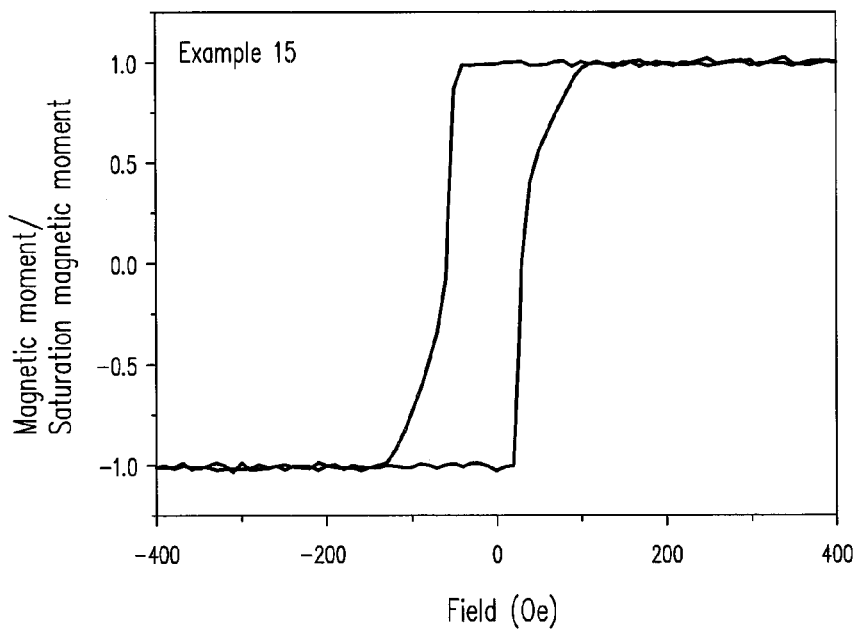
FIG. 16B illustrates an out-of-plane minor hysteresis loop of the stack structure of Example 15.

A stack structure (as shown in FIG. 16A) of Example 15 is fabricated by forming in a sequence of a 30 Å-thick Ta layer/a 30 Å-thick Ru layer/a 4-layers of [4 Å-thick Co/3 Å-thick Pt]/a 4 Å-thick Co layer/an 8 Å-thick Ru layer/a 2-layers of [4 Å-thick Co/3 Å-thick Pt]/a 4 Å° C. Co layer/a 2 Å-thick Ta layer/an 8.5 Å-thick CoFeB layer/a 10 Å MgO layer/a 13 Å-thick CoFeB layer/a 7 Å-thick MgO layer/a 4 Å-thick Al layer—oxidized for 5 secs/a 30 Å-thick Ru layer/a 100 Å-thick Ta layer. Therein, (the 30 Å-thick Ta layer/the 30 Å-thick Ru layer) is the bottom layer 20, (the 4-layers of [4 Å-thick Co/3 Å Pt]/the 4 Å-thick Co layer/the 8 Å-thick Ru layer/the 2-layers of [4 Å-thick Co/3 Å-thick Pt]/the 4 Å-thick Co layer/the 2 Å-thick Ta layer/the 8.5 Å-thick CoFeB layer) is the reference layer 2, the 10 Å-thick MgO layer is the tunneling dielectric layer 4, the 13 Å-thick CoFeB layer is the free layer 6, (the 7 Å-thick MgO layer/the 4 Å-thick Al layer—oxidized for 5 secs) is the capping layer 8, and (the 30 Å-thick Ru layer/the 100 Å-thick Ta layer) is the top layer 30. After coating of this stacking film layer is completed, an annealing process is applied with 360° C. for 20 minutes. An out-of-plane minor hysteresis loop of the stack structure of Example 15 is as shown in FIG. 16B.

Comparative Example 4

The Free Layer is CoFeB

Figure 17A:
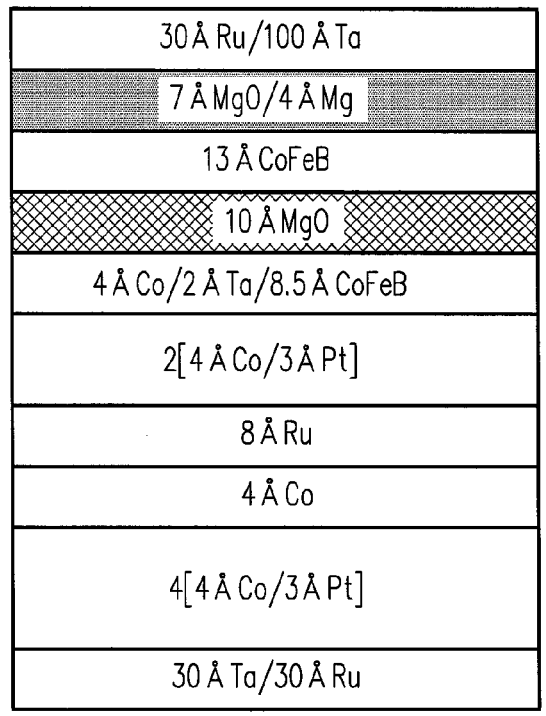
FIG. 17A illustrates the stack structures of Comparative Examples 4.
Figure 17B:
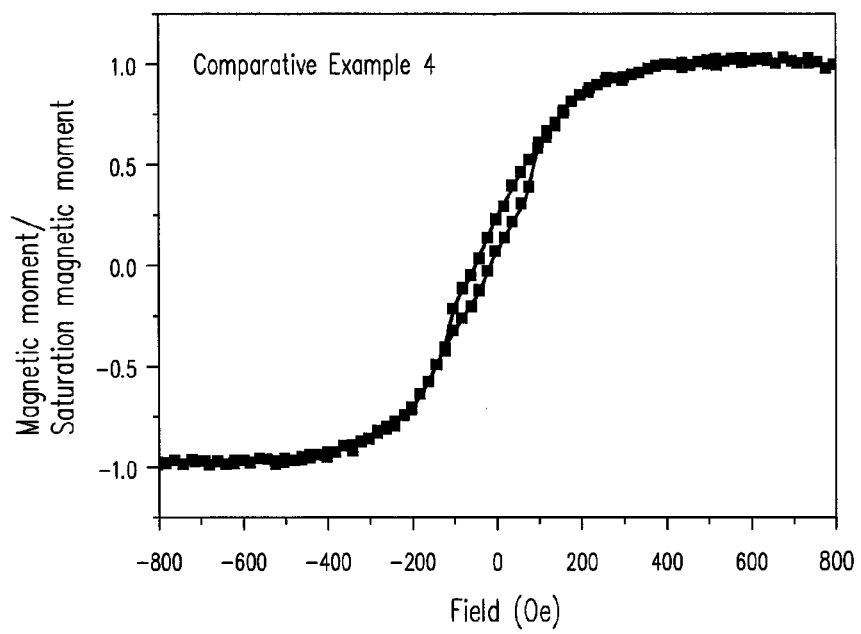
FIG. 17B illustrates an out-of-plane minor hysteresis loops of the stack structure of Comparative Example 4.

Comparative Examples 4 fabricates a stack structures similar to the sequence of Example 15 (as shown in. FIG. 17A), but the 4 Å-thick Al layer—oxidized for 5 secs is changed to a 4 Å-thick Mg layer—oxidized for 5 secs. After coating of this stacking film layer is completed, an annealing process is applied with 360° C. for 20 minutes. An out-of-plane minor hysteresis loop of the stack structure of Comparative Example 15 is as shown in FIG. 17B.

Example 16

The Free Layer is CoFeB/Ta/CoFeB

Figure 18A:
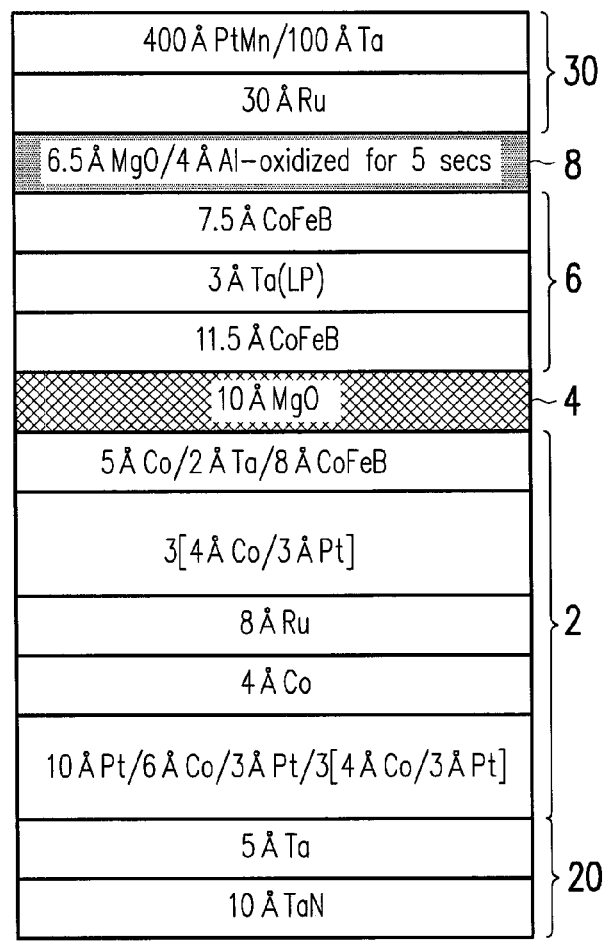
FIG. 18A illustrates the stack structure of Examples 16.
Figure 18B:
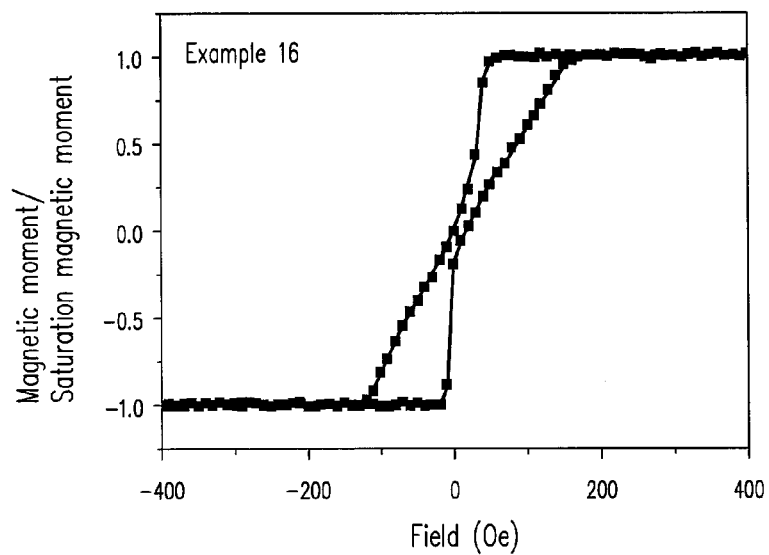
FIG. 18B illustrates an out-of-plane minor hysteresis loop of the stack structure of Example 16.

A stack structure (as shown in FIG. 18A) of Example 11 is fabricated by forming of a 10 Å-thick TaN layer/a 5 Å-thick Ta layer/a 10 Å-thick Pt layer/a 6 Å-thick Co layer/a 3 Å-thick Pt layer/a 3-layers of [4 Å-thick Co/3 Å-thick Pt]/a 4 Å-thick Co layer/an 8 Å-thick Ru layer/a 3-layers of [4 Å-thick Co/3 Å-thick Pt]/a 5 Å-thick Co layer/a 2 Å-thick Ta layer/an 8 Å-thick CoFeB layer/a 10 Å-thick MgO layer/a 11.5 Å-thick CoFeB layer/a 3 Å-thick Ta layer (LP)/a 7.5 Å-thick CoFeB layer/a 6.5 Å-thick MgO layer/a 4 Å-thick Al layer—oxidized for 5 secs/a 30 Å-thick Ru layer/a 400 Å-thick PtMn layer/a 100 Å-thick Ta layer. Therein, (the 10 Å-thick TaN layer/the 5 Å-thick Ta layer) is the bottom layer 20, (the 10 Å-thick Pt layer/the 6 Å-thick Co layer/the 3 Å-thick Pt layer/the 3-layers of [4 Å-thick Co/3 Å-thick Pt]/the 4 Å-thick Co layer/the 8 Å-thick Ru layer/the 3-layers of [4 Å-thick Co/3 Å-thick Pt]/the 5 Å-thick Co layer/the 2 Å-thick Ta layer/the 8 Å-thick CoFeB layer) is the reference layer 2, the 10 Å-thick MgO layer is the tunneling dielectric layer 4, the (the 11.5 Å-thick CoFeB layer/the 3 Å-thick Ta layer (LP)/the 7.5 Å-thick CoFeB layer) CoFeB layer is the free layer 6, (the 6.5 Å-thick MgO layer/the 4 Å-thick Al layer—oxidized for 5 secs) is the capping layer 8, and (the 30 Å-thick Ru layer/the 400 Å-thick PtMn layer/the 100 Å-thick Ta layer) is the top layer 10. After coating of this stacking film layer is completed, an annealing process is applied with 400° C. for 30 minutes. An out-of-plane minor hysteresis loop of the stack structure of Example 11 is as shown in FIG. 18B.

Comparative Example 5

The Free Layer is CoFeB/Ta/CoFeB

Figure 19A:
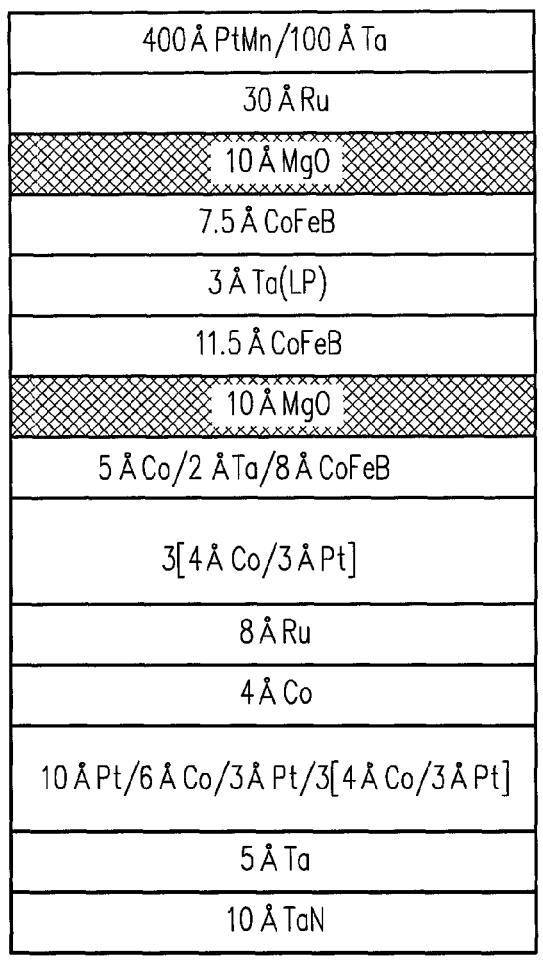
FIG. 19A illustrates the stack structures of Comparative Examples 5.
Figure 19B:
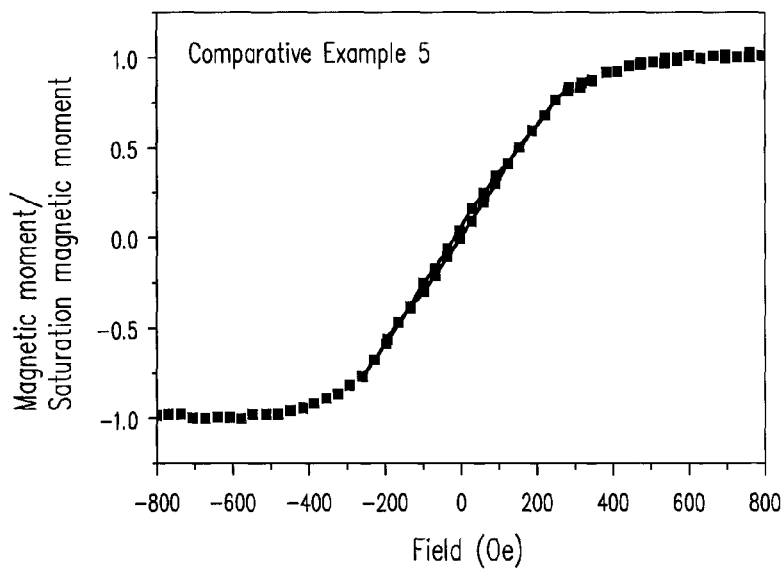
FIG. 19B illustrates an out-of-plane minor hysteresis loops of the stack structure of Comparative Example 5.

Comparative Examples 5 fabricates a stack structures similar to the sequence of Example 11 (as shown in FIG. 19A), but (the 7 Å-thick MgO layer/the 4 Å-thick Al layer—oxidized for 5 secs) is changed to the 10 Å-thick MgO layer. After coating of this stacking film layer is completed, an annealing process is applied with 400° C. for 30 minutes. An out-of-plane minor hysteresis loop of the stack structure of Comparative Example 5 is as shown in FIG. 19B.

Result of Example 15 shows that the MgAlxOy capping layer formed by covering the CoFeB layer with the 7 Å-thick MgO layer and the 4 Å-thick Al layer before performing an oxidation thereto, the free layer may still exhibit the PMA property after the annealing process is applied with 360° C. for 20 minutes Result of Comparative Example 4 shows that when the capping layer on the CoFeB layer is changed into the 7 Å-thick MgO layer and the 4 Å-thick Mg layer before performing an oxidation thereto, the PMA property of the free layer is gone after the annealing process is applied with 360° C. for 20 minutes.

Similarly, result of Example 16 shows that the MgAlxOy capping layer formed by covering the CoFeB layer with the 6.5 Å-thick MgO layer and the 4 Å-thick Al layer before performing an oxidation thereto, the free layer may still exhibit the PMA property after the annealing process is applied with 400° C. for 30 minutes, which is compatible to the existing CMOS process. Result of Comparative Example 5 shows that when the capping layer on the CoFeB layer is changed into the 10 Å-thick MgO layer, the PMA property of the free layer is gone after the annealing process is applied with 400° C. for 30 minutes.

The thickness of the MgO layer in the embodiments of the disclosure is not limited by the foregoing experiments. When the MgO layer having the thickness of 3.5 Å to 8 Å is used to from the MgAlxOy capping layer, the out-of-plane hysteresis loops of the stack structures are quite similarly to each other.

In comparison with the MgO capping layer, the MgAlxOy capping layer adopted in the embodiments of the disclosure may improve the resistance to the thermal annealing for the PMA free layer. Accordingly, the MTJ free layer may provide enhanced characteristic in crystallising, so that a magnetoresistance (MR) and a quality of magnetoresistance tunneling oxide layer may be improved and may be compatible to the existing CMOS process.

Based on above, in the capping layer (collectively called MgAlxOy) consisted of magnesium, aluminum and oxygen formed on the free layer according to the disclosure, a resistance to the thermal annealing is improved and a thermal stability is enhanced to more than two times, so that a heat resistance of the device may be enhanced and to be compatible to the CMOS process, accordingly.

Although the disclosure has been described with reference to the above embodiments, it is apparent to one of the ordinary skill in the art that modifications to the described embodiments may be made without departing from the spirit of the disclosure. Accordingly, the scope of the disclosure will be defined by the attached claims not by the above detailed descriptions.

The invention claimed is:

1. A perpendicular magnetic anisotropy (PMA) magnetic tunnel junction device, comprising:
    a tunneling dielectric layer having a first surface and a second surface;
    a reference layer having a magnetization direction fixed on a direction perpendicular to a surface of the reference layer and disposed on the first surface of the tunneling dielectric layer;
    a free layer having a magnetization direction parallel to or anti-parallel to the magnetization direction of the reference layer, and disposed on the second surface of the tunneling dielectric layer; and
    a capping layer consisted of magnesium, aluminum and oxygen, and disposed on the free layer, wherein the capping layer comprises:
    a magnesium oxide (MgO) layer disposed on the free layer and having a surface provided with a plurality of gaps; and
    an aluminum oxide (AlOx) layer filled in the gaps of the magnesium oxide layer.

2. The perpendicular magnetic anisotropy magnetic tunnel junction device of claim 1, wherein the reference layer includes a perpendicular magnetization material.

3. The perpendicular magnetic anisotropy magnetic tunnel junction device of claim 2, wherein the perpendicular magnetization material includes a CoFeB single film and a combination of a Co/Pt multilayer film, a Co/Pd multilayer film, a Co/Ni multilayer film, a CoPd alloy film, a FePt alloy film, a TbFeCo alloy, or a Ru layer is further included in between each of above-said film layers.

4. The perpendicular magnetic anisotropy magnetic tunnel junction device of claim 1, wherein a material of the tunneling dielectric layer is magnesium oxide.

5. The perpendicular magnetic anisotropy magnetic tunnel junction device of claim 1, wherein the free layer is a CoFeB film, a CoFe film, a Fe film or a multilayer film including a combination of the above-said materials.

6. The perpendicular magnetic anisotropy magnetic tunnel junction device of claim 5, wherein a non-magnetic metal layer is further included between each film layer among the multilayer film.

7. A method of fabricating a perpendicular magnetic anisotropy magnetic tunnel junction device, comprising:
    forming a tunneling dielectric layer;
    forming a reference layer on a first surface of the tunneling dielectric layer, and the reference layer having a magnetization direction fixed on a direction perpendicular to a surface of the reference layer;
    forming a free layer on the second surface of the tunneling dielectric layer, the free layer having a magnetization direction parallel to or anti-parallel to the magnetization direction of the reference layer and covering on the tunneling dielectric layer; and
    forming a capping layer consisted of magnesium, aluminum and oxygen to cover the free layer, wherein a method of forming the capping layer comprises:
    forming a magnesium oxide layer to cover the free layer;
    forming an aluminum layer to cover the magnesium oxide layer and to fill in at least one gap of the magnesium oxide layer; and
    performing an oxidation process to oxidize the aluminum layer into an aluminum oxide layer.

8. The method of fabricating a perpendicular magnetic anisotropy magnetic tunnel junction device of claim 7, wherein a method of forming the capping layer includes a sputtering process and an atomic layer deposition process.

9. The method of fabricating a perpendicular magnetic anisotropy magnetic tunnel junction device of claim 7, wherein the oxidation process includes a plasma oxidation process or a natural oxidation.

10. The method of fabricating a perpendicular magnetic anisotropy magnetic tunnel junction device of claim 7, wherein the reference layer, the tunneling dielectric layer, the free layer and the capping layer are sequentially formed.

11. The method of fabricating a perpendicular magnetic anisotropy magnetic tunnel junction device of claim 7, wherein the capping layer, the free layer, the tunneling dielectric layer and the reference layer are sequentially formed.

* * * * *